United States Patent
Han et al.

(10) Patent No.: US 8,716,694 B2
(45) Date of Patent: May 6, 2014

(54) SEMICONDUCTOR LIGHT EMITTING DEVICE

(71) Applicant: Samsung Electronics Co., Ltd., Gyeonggi-do (KR)

(72) Inventors: Sang Heon Han, Gyeonggi-do (KR); Jeong Wook Lee, Gyeonggi-do (KR); Jae Sung Hyun, Seoul (KR); Jin Young Lim, Gyeonggi-do (KR); Dong Joon Kim, Gyeonggi-do (KR); Young Sun Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/707,027

(22) Filed: Dec. 6, 2012

(65) Prior Publication Data

US 2013/0146840 A1   Jun. 13, 2013

(30) Foreign Application Priority Data

Dec. 7, 2011   (KR) .................. 10-2011-0130255

(51) Int. Cl.
*H01L 33/32* (2010.01)
*H01L 33/06* (2010.01)

(52) U.S. Cl.
USPC .................. 257/23; 257/E33.028

(58) Field of Classification Search
None
See application file for complete search history.

(56) References Cited

U.S. PATENT DOCUMENTS

| | | | | |
|---|---|---|---|---|
| 6,252,894 B1* | 6/2001 | Sasanuma et al. | | 372/45.01 |
| 6,664,560 B2* | 12/2003 | Emerson et al. | | 257/14 |
| 6,734,033 B2* | 5/2004 | Emerson et al. | | 438/29 |
| 2002/0014632 A1* | 2/2002 | Kaneyama et al. | | 257/103 |
| 2003/0020061 A1* | 1/2003 | Emerson et al. | | 257/14 |
| 2006/0246612 A1* | 11/2006 | Emerson et al. | | 438/22 |

(Continued)

FOREIGN PATENT DOCUMENTS

| KR | 1020090065612 | 6/2009 |
|---|---|---|
| KR | 1020100027407 | 3/2010 |
| KR | 1020100070250 | 6/2010 |
| KR | 1020100082479 | 7/2010 |

OTHER PUBLICATIONS

Shatalov, M.; Zhang, J.; Chitnis, A.S.; Adivarahan, V.; Yang, J.; Simin, G.; Khan, M.A., "Deep ultraviolet light-emitting diodes using quaternary AlInGaN multiple quantum wells," Selected Topics in Quantum Electronics, IEEE Journal of , vol. 8, No. 2, pp. 302,309, Mar./Apr. 2002.*

(Continued)

*Primary Examiner* — Thomas L Dickey
*Assistant Examiner* — Joseph Schoenholtz
(74) *Attorney, Agent, or Firm* — F. Chau & Associates, LLC

(57) ABSTRACT

A semiconductor light emitting device includes: n-type and p-type semiconductor layers; and an active layer disposed between the n-type and p-type semiconductor layers. The active layer has a structure in which a plurality of quantum well layers and a plurality of quantum barrier layers are alternately disposed, wherein the plurality of quantum well layers are made of $Al_xIn_yGa_{1-x-y}N$ ($0 \le x < 1$, $0 < y \le 1$) and each of the plurality of quantum well layers contains a different indium (In) content. And, among the plurality of quantum barrier layers, a quantum barrier layer adjacent to a quantum well layer having a higher indium (In) content is thicker than a quantum barrier layer adjacent to a quantum well layer having a lower indium (In) content.

20 Claims, 3 Drawing Sheets

(56) References Cited

U.S. PATENT DOCUMENTS

2009/0014713 A1* 1/2009 Kang et al. .................. 257/13
2010/0176372 A1* 7/2010 Yoo et al. .................... 257/13
2011/0133156 A1* 6/2011 Won et al. ................... 257/13

OTHER PUBLICATIONS

Xu, Jiuru and Schubert, Martin F. and Zhu, Di and Cho, Jaehee and Schubert, E. Fred and Shim, Hyunwook and Sone, Cheolsoo, "Effects of polarization-field tuning in GaInN light-emitting diodes" Applied Physics Letters, 99, 041105 (2011).*

Chernyakov, A.E., M.M. Sobolev, V.V. Ratnikov, N.M. Shmidt, and E.B. Yakimov. "Nonradiative Recombination Dynamics in InGaN/GaN LED Defect System." Superlattices and Microstructures 45.4-5 (2009): 301-07.*

Guan-Bo Lin; Dong-Yeong Kim; Qifeng Shan; Jaehee Cho; Schubert, E.F.; Hyunwook Shim; Cheolsoo Sone; Jong Kyu Kim, "Effect of Quantum Barrier Thickness in the Multiple-Quantum-Well Active Region of GaInN/GaN Light-Emitting Diodes," Photonics Journal, IEEE, vol. 5, No. 4, pp. 1600207,1600207, Aug. 2013.*

Wang, T., Y. H. Liu, Y. B. Lee, J. P. Ao, J. Bai, and S. Sakai. "1 MW AlInGaN-based Ultraviolet Light-emitting Diode with an Emission Wavelength of 348 Nm Grown on Sapphire Substrate." Applied Physics Letters vol. 81 No. 14 (2002): 2508.*

Kim, D.J., et. al., "Effect of Barrier Thickness on Interface and Optical Properties of InGaN/GaN Multiple Quantum Wells", Jpn. J. Appl. Phys. vol. 40 (2001), pp. 3085-3088.*

Le, L.C., et. al. "Effect of V-defects on the performance deterioration of InGaN/GaN multiple-quantum well light-emitting diodes with varying barrier layer thickness", Journal of Applied Physics 114, 143706 (2013).*

* cited by examiner

SEMICONDUCTOR LIGHT EMITTING DEVICE

CROSS-REFERENCE TO RELATED APPLICATIONS

This application claims the priority of Korean Patent Application No. 10-2011-0130255 filed on Dec. 7, 2011, in the Korean Intellectual Property Office, the entirety of which is incorporated by reference herein.

TECHNICAL FIELD

The present inventive concept relates to a semiconductor light emitting device.

DISCUSSION OF THE RELATED ART

A light emitting diode (LED) is a type of semiconductor light emitting device. LEDs are capable of generating light of various colors according to electron-hole recombination at p-n semiconductor junctions when current is applied thereto. Compared with a filament-based (incandescent) light, a semiconductor LED has characteristics such as longer lifespan, lower power consumption, excellent initial drive efficiencies, and accordingly, demand for LEDs has continued to grow. Recently, a group III-nitride semiconductor LEDs capable of emitting short-wavelength blue light has come to prominence, which made white light LEDs more available.

As nitride semiconductor LEDs have made remarkable progress since first being developed, the utilization thereof has been greatly expanded and research into utilizing semiconductor light emitting devices for the purpose of general illumination, as well as for electrical apparatus light sources, has been actively undertaken. Related art nitride LEDs have in the past largely been used as components of low-current/low output mobile products, but recently, the utilization of nitride light emitting devices has extended into the field of high current/high output devices.

In the operation of a nitride semiconductor grown in a polarity direction, an intense electric field is applied across the interior of an active layer due to polarization. The generation of such an internal electric field makes a wave function of electrons and holes in the active layer spatially separated to degrade the recombination probability.

SUMMARY

An aspect of the present inventive concept provides a semiconductor light emitting device in which a thickness of a layer constituting an active layer and band gap energy thereof are optimized to minimize an influence of piezoelectric polarization affecting the active layer, thereby minimizing an increase in a driving voltage while enhancing carrier recombination efficiency.

An aspect of the present inventive concept provides a method capable of producing a semiconductor light emitting device having an enhanced internal quantum efficiency by minimizing the polarization effect.

According to an aspect of the present inventive concept, there is provided a semiconductor light emitting device including: n-type and p-type semiconductor layers; and an active layer disposed between the n-type and p-type semiconductor layers and having a structure in which a plurality of quantum well layers and a plurality of quantum barrier layers are stacked alternately, wherein each of the plurality of quantum well layers is made of $Al_xIn_yGa_{1-x-y}N$ ($0 \leq x < 1$, $0 < y \leq 1$) and each of the plurality of quantum well layers contains a different indium (In) content. And, among the plurality of quantum barrier layers, a quantum barrier layer adjacent to a quantum well layer having a higher indium (In) content is thicker than a quantum barrier layer adjacent to a quantum well layer having a lower indium (In) content.

It will be understood that when an element is referred to as being "adjacent" to another element, it can be directly adjacent to the other element or intervening elements may be present. In contrast, when an element is referred to as being "directly adjacent" to another element, there are no intervening elements present.

Among the plurality of quantum well layers, the quantum well layer having a lower indium (In) content may be thicker than that having a higher indium (In) content.

Among the plurality of quantum well layers, the quantum well layer having a lower indium (In) content may be disposed to be more adjacent to the p-type semiconductor layer than that having a higher indium (In) content does.

Among the plurality of quantum well layers, a wavelength of light emitted from the quantum well layer having a higher indium (In) content and that emitted from the quantum well layer having a lower indium (In) content may be substantially the same or identical.

Wavelengths of light emitted from each of the plurality of quantum well layers may be the same or substantially the same (e.g., the same as perceived by a human observer).

The plurality of quantum well layers may be formed gradually thicker in a direction toward the p-type semiconductor layer (i.e., the plurality of quantum well layers may be formed thicker the closer they are to the p-type semiconductor layer).

The contents of indium (In) in the plurality of quantum well layers may be gradually reduced in towards the p-type semiconductor layer.

The thicknesses of the plurality of quantum barrier layers may be gradually reduced towards the p-type semiconductor layer.

Among the plurality of quantum barrier layers, the thickness of a quantum barrier layer adjacent to a quantum well layer having a relatively higher indium (In) content (e.g., in a direction nearer to the p-type semiconductor layer) is greater than the thickness of a quantum barrier layer adjacent to a quantum well layer having a lower indium (In) content.

As the indium (In) content of the plurality of quantum well layers is increased, the magnitude of piezoelectric polarization may be greater.

The plurality of quantum barrier layers may contain no indium (In).

The plurality of quantum barrier layers have a lower indium (In) content than that of the plurality of quantum well layers adjacent thereto.

Various exemplary embodiments of the present inventive concept will now be described in detail with reference to the accompanying drawings.

The inventive concept may, however, be embodied in many different forms and should not be construed as being limited to the exemplary embodiments set forth herein. Rather, these exemplary embodiments are provided so that this disclosure will be thorough and complete, and the claims will fully convey the scope of the inventive concept to those skilled in the art. In the drawings, the shapes and dimensions of elements may be exaggerated for clarity, and the same reference numerals will be used throughout to designate the same or like components.

BRIEF DESCRIPTION OF THE DRAWINGS

The above and other aspects and features of the present inventive concept will be more clearly understood from the following detailed description taken in conjunction with the accompanying drawings, in which.

DETAILED DESCRIPTION OF EXEMPLARY EMBODIMENTS

Figure 1:
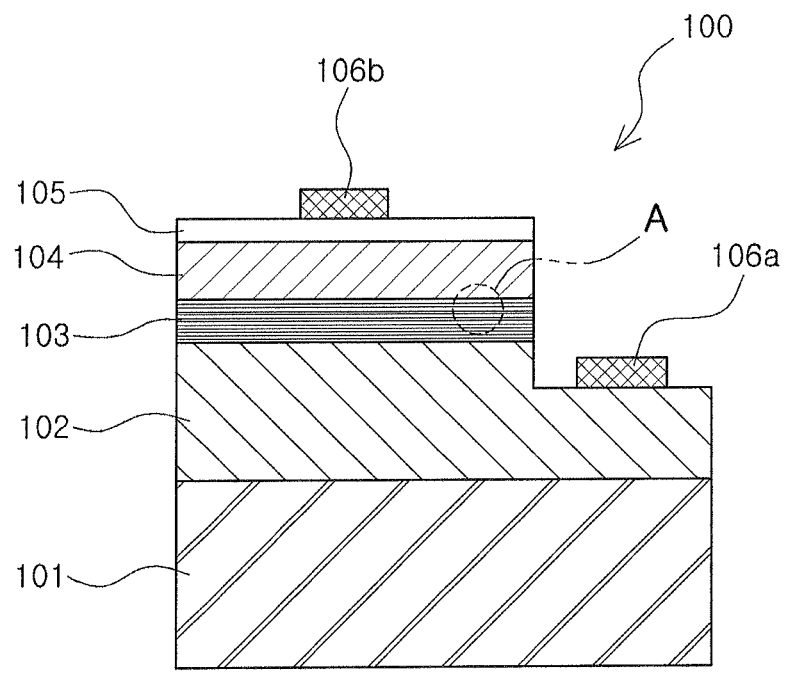
FIG. 1 is a cross-sectional view schematically showing a semiconductor light emitting device (LED) according to an exemplary embodiment of the present inventive concept.
Figure 2:
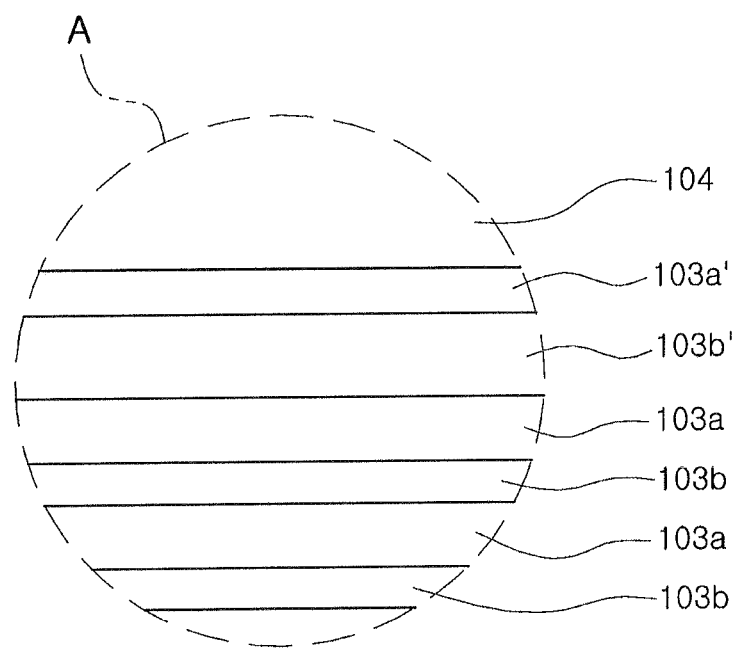
FIG. 2 is an enlarged view of an active layer that may be employed in the semiconductor light emitting device of FIG. 1.
Figure 3:
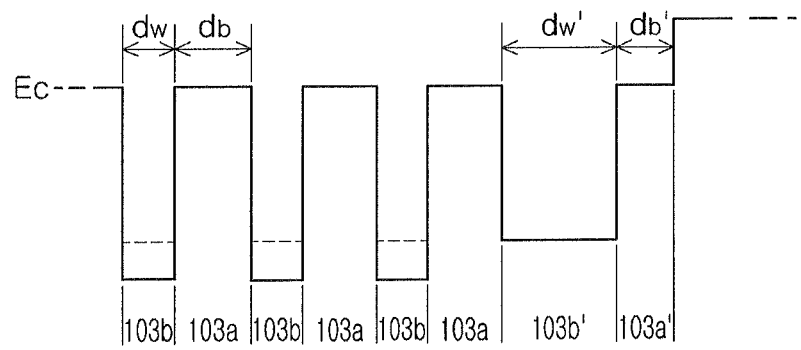
FIG. 3 is a view showing an energy band level of a conduction band of an active layer that may be employed in the semiconductor light emitting device of FIG. 1 and near or around the active layer.

FIG. 1 is a cross-sectional view schematically showing a semiconductor light emitting device (LED) 100 according to an exemplary embodiment of the present inventive concept. FIG. 2 is an enlarged view of an active layer that may be employed in the semiconductor light emitting device of FIG. 1. FIG. 3 is a view showing an energy band level of a conduction band of an active layer (e.g. of FIG. 2) that may be employed in the semiconductor light emitting device of FIG. 1 and near or around the active layer.

First, with reference to FIG. 1, a semiconductor light emitting device 100 according to the present embodiment includes a substrate 101, an n-type semiconductor layer 102, an active layer 103, a p-type semiconductor layer 104, and an ohmic-electrode layer 105. First and second electrodes 106a and 106b may be formed on upper surfaces of the n-type semiconductor layer 102 and the ohmic-electrode layer 105, respectively. Here, the terms 'upper portion', 'upper surface', 'lower portion', 'lower surface', 'lateral surface', or the like, are used based on the directionality of the drawings, which may be changed according to the direction in which the device is actually disposed in use. Also, as for subscripts such as x, y, z, or the like, used in empirical formulas as described hereinafter, although the same subscripts are used for different materials, they are unrelated to each other unless otherwise mentioned.

The substrate 101 is a semiconductor growth substrate. As the substrate 101, a substrate made of an insulating, conductive, or semiconductive material such as sapphire, Si, SiC, $MgAl_2O_4$, MgO, $LiAlO_2$, $LiGaO_2$, GaN, or the like, may be used. In this case, sapphire having electrical insulation characteristics may most preferably be used. Sapphire is a crystal having Hexa-Rhombo R3c symmetry, of which lattice constants in c-axis and a-axis directions are 13.001 Å and 4.758 Å, respectively. A sapphire crystal has a C (0001) plane, an A (1120) plane, an R (1102) plane, and the like. In this case, a nitride thin film can be relatively easily formed on the C plane of the sapphire crystal, and because sapphire crystal is stable at high temperatures, it is commonly used as a material for a nitride growth substrate.

Here, however, when the nitride thin film is grown from the C plane, a strong electric field may be formed in the nitride thin film due to a piezoelectric effect. Meanwhile, a silicon (Si) substrate may be appropriately used as the substrate 101, and mass-production can be facilitated by using the silicon (Si) substrate which may have a large diameter and be relatively cheap. When the silicon (Si) substrate is used, a nucleation layer made of a material such as $Al_xGa_{1-x}N$ ($0 \leq x \leq 1$) may be formed on the substrate 101 and a nitride semiconductor having a desired structure may be grown on the nucleation layer.

The n-type and p-type semiconductor layers 102 and 104 may be made of a nitride semiconductor, e.g., a material having a composition of $Al_xIn_yGa_{1-x-y}N$ ($0 \leq x \leq 1$, $0 \leq y \leq 1$, $0 \leq x+y \leq 1$). Each of the semiconductor layers 102 and 104 may be configured as a single layer, or may include a plurality of layers each having different characteristics such as a doping concentration, a composition, or the like. The n-type and p-type semiconductor layers 102 and 104 may be made of an AlInGaP or AlInGaAs semiconductor, besides the nitride semiconductor. The active layer 103, disposed between the n-type and p-type semiconductor layers 102 and 104, emits light having a certain energy level, according to the recombination of electrons and holes and may have a multi-quantum well (MQW) structure in which quantum well layers 103b and quantum barrier layers 103a are alternately laminated. Here, in the case of the nitride semiconductor, the quantum well layers 103b may be made of InGaN (the content of In and Ga may be variable) and the quantum barrier layers 103a may include regions made of GaN, InGaN (the content of In and Ga may be variable and the content of In may be less than that of the quantum well layers), AlInGaN (the content of Al, In, and Ga may be variable), or the like. In the present embodiment, thicknesses and compositions of the quantum well layers 103b and the quantum barrier layers 103a are optimized to enhance carrier recombination efficiency, details of which will be described later.

The n-type and p-type semiconductor layers 102 and 104 and the active layer 103 constituting the light emitting structure may be grown by using various processes known in the art, such as metal organic chemical vapor deposition (MOCVD), hydride vapor phase epitaxy (HVPE), molecular beam epitaxy (MBE), and the like. Also, although not shown, in order to lessen stress acting on the n-type semiconductor layer 102 to thus enhance crystallinity, a buffer layer may be formed on the substrate 101 before the n-type semiconductor layer 102 is formed. Also, although not shown, an electron blocking layer having a relatively high energy band gap may be interposed between the active layer 103 and the p-type semiconductor layer 104 to prevent electrons from overflowing upon passing through the active layer 103.

The ohmic-electrode layer 105 may be made of a material that exhibits electrical ohmic-characteristics with the p-type semiconductor layer 104. The ohmic-electrode layer 105 may be formed of a transparent conductive oxide such as ITO, CIO, ZnO, or the like, that has a high level of light transmittance and relatively excellent ohmic-contact performance among materials used for a transparent electrode. Alternatively, the ohmic-electrode layer 105 may be made of a light-reflective material, e.g., a highly reflective metal, and in this case, the device 100 may be used in a so-called flip-chip structure mounted toward a lead frame, or the like, of the first and second electrode 106a and 106b package. Here, the ohmic-electrode layer 105 may be omitted from various alternative implementations of the present exemplary embodiment and may be excluded according to varying circumstances.

The first and second electrodes 106a and 106b may be made of a material known in the art having electrical conductivity. For example, the first and second electrodes 106a and 106b may be formed by depositing, sputtering, or the like, one or more of silver (Ag), aluminum (Al), nickel (Ni), chromium (Cr), and the like. In the structure illustrated in FIG. 1, the first and second electrodes 106a and 106b are formed on the n-type semiconductor layer 102 and the ohmic-electrode layer 105, respectively, but such an electrode (106a, 106b) formation scheme is just an example, and electrodes may be formed in various positions of the light emitting structure including the n-type semiconductor layer 102, the active layer 103, and the p-type semiconductor layer 104 as shown in the exemplary embodiment of FIG. 7.

The MQW structure of the active layer 103 proposed in the present embodiment will be described in detail with reference to FIGS. 2 and 3. In the present embodiment, the plurality of quantum well layers 103b may be made of $Al_xIn_yGa_{1-x-y}N$ (0≤x<1, 0<y≤1), and here, the quantum well layers each contain a different indium (In) content, and the band gap energy thereof may vary according to the varied indium (In) content. For example, with reference to FIG. 3, among the plurality of quantum well layers 103b, a single quantum well layer 103b' disposed to be adjacent to the p-type semiconductor layer 104 (right side of figure) has a lower indium (In) content than that of three left quantum well layers 103b adjacent to the n-type semiconductor layer 102 (left side of figure). Namely, the one quantum well layer 103b' disposed to be adjacent to the p-type semiconductor layer 104 (right side) may have a higher level of band gap energy.

The scheme of adjusting the indium (In) content of the plurality of quantum well layers 103b to be different may be employed when some of the plurality of quantum well layers 103b are intended to have different thicknesses. In the present embodiment, as shown in detail in FIG. 3, the thickness $d_w'$ of the quantum well layer 103b' adjacent to the p-type semiconductor layer 104, among the plurality of quantum well layers 103b, is greater than the thickness $d_w$ of the other quantum well layers not adjacent to the p-type semiconductor layer 104. Since holes are heavier and have a lower level of mobility than electrons, electrons and holes are mostly recombined in the quantum well layer 103b' adjacent to the p-type semiconductor layer 104. Thus, in the present embodiment, the thickness of the quantum well layer 103b' adjacent to the p-type semiconductor layer 104 is increased to enhance carrier recombination efficiency.

Here, however, when the thickness of the quantum well layer 103b is relatively greater, the energy level of electrons in the quantum well layer 103b is relatively lower. In FIG. 3, the energy level of the three quantum well layers 103b to the left having a relatively small thickness is higher than energy level of the single quantum well layer 103b' to the right) adjacent to the p-type semiconductor layer 104. Thus, in order to maintain the wavelength of light emitted from the plurality of quantum well layers 103b at a uniform level, the quantum well layers 103b having a smaller thickness, namely, the three left quantum well layers 103b, are made of a material containing a high indium (In) content which lowers the band gap energy thereof. Accordingly, the energy level of the three quantum well layers 103b to the left may be raised to the level indicated by the dotted line in FIG. 3. As maintaining the wavelength of light emitted from the plurality of quantum well layers 103b at a uniform level is a design option, the quantum well layers 103b having different thicknesses may contain the same indium (In) content or various indium (In) content to thereby emit two or more different colors of light.

In the present embodiment, when the plurality of quantum well layers 103b include those having different contents of indium (In), the magnitude of piezoelectric polarization affecting the quantum well layer 103b having a higher indium (In) content is relatively increased, so the influence of piezoelectric polarization is lessened. In FIG. 3, the magnitude of piezoelectric polarization applied to the three thinner quantum well layers 103b to the left having a higher indium (In) content is greater than that applied to the one thicker quantum well layer 103b' on the right having a lower indium (In) content, and the influence of such piezoelectric polarization may be accumulated in a growth direction of the active layer 103 to affect the entirety of the active layer 103. Thus, as an electric field generated by piezoelectric polarization acting on the active layer 103 is increased, wave functions of electrons and holes are spatially inconsistent, lowering recombination efficiency.

In the present embodiment, in order to reduce the influence of piezoelectric polarization due to the quantum well layer 103b having a higher indium (In) content, the quantum barrier layer 103a adjacent thereto is adjusted to be relatively thicker. Among the plurality of quantum barrier layers 103a, the thickness $d_b$ of the quantum barrier layer 103a adjacent to the quantum well layer 103b on the left having a higher indium (In) content is greater than the thickness $d_b'$ of the quantum barrier layer 103a' on the right adjacent to the quantum well layer 103b' having a lower indium (In) content. In this specification, the fact that the quantum barrier layer is formed to be 'adjacent' to the quantum well layer 103b means that the quantum barrier layer is adjacent to the quantum well layer in the direction towards the end of the stack where the p-type semiconductor layer 104 is positioned.

The plurality of quantum barrier layers 103a may be made of a material, e.g., GaN, that does not contain indium (In) so as to have a level of band gap energy higher than that of the quantum well layers 103b, or the plurality of quantum barrier layers 103a may be made of a material having a lower indium (In) content. Since the magnitude of piezoelectric polarization of the quantum barrier layers 103a is smaller than that of the quantum well layers 103b, the quantum barrier layers 103a may be formed to be thicker adjacent to the quantum well layers 103b so as to lessen piezoelectric polarization. In other words, the thickness $d_b$ of the quantum barrier layer 103a adjacent to the quantum well layer 103b having a high indium (In) content is adjusted to be greater so as to reduce the influence of piezoelectric polarization affecting the entirety of the active layer 103. Also, the thickness $d_b'$ of the quantum barrier layer 103a' adjacent to the quantum well layer 103b' having a relatively small magnitude of piezoelectric polarization may be adjusted to be relatively small, and in this case, the thickness $d_b'$ of the quantum barrier layer 103a' may be adjusted to be higher to reduce piezoelectric polarization. But to not do so would minimize an increase in a driving voltage that would otherwise result from a thick quantum barrier layer 103a.

Figure 6:
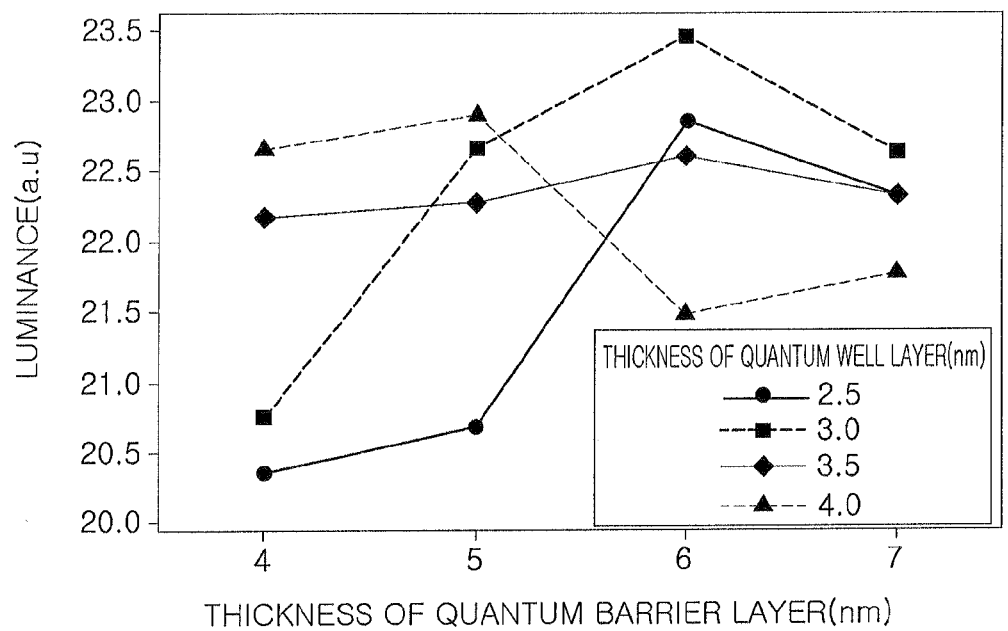
FIG. 6 is a graph of luminance of the light emitting device over a change in the thickness of quantum well layers and quantum barrier layers.

Luminance efficiency varies depending on the thickness of the quantum well layers and the quantum barrier layers will be further described in with reference to FIG. 6.

FIG. 6 is a graph of luminance of the light emitting device over a change in the thickness of quantum well layers and of quantum barrier layers in four exemplary cases. The present simulation graph was obtained experimentally with an active layer including quantum well layers and quantum barrier layers each having the same thickness. The circles indicate the case of a quantum well layer having thickness of 2.5 nm. The squares indicate the case of a quantum well layer having thickness of 3.0 nm. The diamonds indicate the case of a quantum well layer having thickness of 3.5 nm. The triangles indicate the case of a quantum well layer having thickness of 4.0 nm. First, when the thicknesses of quantum well and quantum barrier layers were 2.5 nm and 3.0 nm, it can be seen that luminance thereof are considerably changed according to the thicknesses of the quantum well layers. In comparison, when the thicknesses of the quantum well and quantum barrier layers were 3.5 nm and 4.0 nm, the degree of changing luminance over the thickness of the quantum barrier layers is less, and in particular, the quantum well layer having a thickness of 4.0 nm tended to have greater luminance when the quantum barrier layer had a smaller thickness. Based on these results, the thickness of the quantum barrier layer exhibiting optimum luminance may be changed according to the thickness of the quantum well layer and the reason is deduced to be because an increase in the thickness of the quantum barrier layer reduces the influence of piezoelectric polarization but increases a driving voltage.

The active layer 103 having the structure proposed in the present embodiment can be used for a structure in which piezoelectric polarization due to the quantum well layers 103b having high indium (In) content is reduced while an increase in the driving voltage is minimized, and in particular, the quantum well layer 103b' in which a carrier recombination occurs relatively actively is relatively thick and indium (In) content of the thinner quantum well layers 103b is increased. In the present embodiment, the structure in which the quantum well layer having a low indium (In) content is disposed to be adjacent to the p-type semiconductor layer 104 in comparison to the quantum well layers having a high indium (In) content has been described. But the present inventive concept is not necessarily limited thereto. Thus, the quantum well layer having a low indium (In) content may be disposed farther from the p-type semiconductor layer 104 than the quantum well layer having a high indium (In) content. Thus, the quantum well layer having a low indium (In) content may alternatively be disposed to be closer to or adjacent to the n-type semiconductor layer 102 according to alternative implementations of present an embodiment. In other words, no matter where the quantum well layer 103b having a relatively higher indium (In) content is positioned in various embodiments, the quantum barrier layer 103a adjacent thereto may be formed to be relatively thick and the quantum barrier layer 103a adjacent to the quantum well layer 103b having a relatively low indium (In) content is formed to be relatively thin, thereby improving luminance efficiency and driving voltage characteristics.

Figure 4:
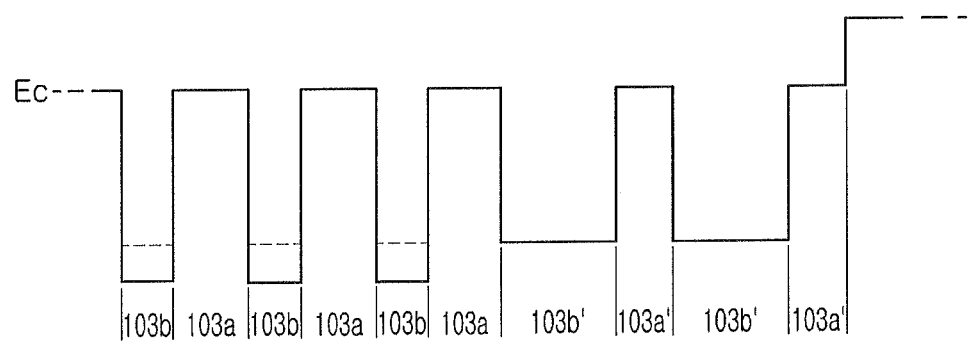
FIGS. 4 and 5 are views showing configurations of active layers that may be employed in modifications of the exemplary embodiment of FIG. 1 together with peripheral regions thereof by energy levels of conduction bands, respectively.
Figure 5:
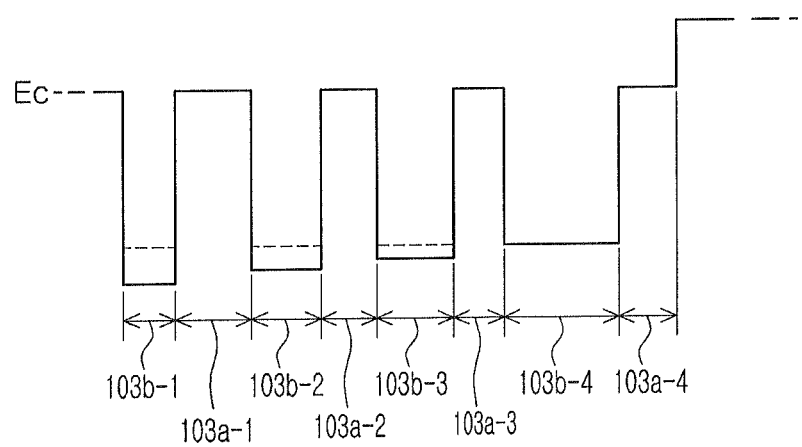

FIGS. 4 and 5 are views showing configurations of active layers that may be alternatively employed in various modifications of the exemplary embodiment of FIG. 1 together with peripheral regions thereof illustrated by the energy levels of conduction bands, respectively.

As shown in the modification illustrated in FIG. 4, in order to secure a larger region in which carriers are recombined, a plurality of quantum well layers 103b' having a relatively greater thickness may be provided. Also, in the modification illustrated in FIG. 4, the relatively thinner quantum well layer 103b may contain a high indium (In) content to compensate for an energy level increase due to the small thickness thereof. And the relatively thicker quantum barrier layer 103a may be disposed to be adjacent to the relatively thinner quantum well layer 103b in order to reduce piezoelectric polarization increased by the high indium (In) content. Also, the quantum barrier layers 103a' (e.g., two quantum barrier layers in the example of FIG. 4) may be formed to be relatively thinner than each adjacent quantum well layers 103b' being relatively thick and having a relatively low indium (In) content.

Also, in another modification as shown in FIG. 5, a plurality of quantum well layers 103b-1, 103b-2, 103b-3, and 103b-4 may be formed to be increasingly thicker with closer proximity to the p-type semiconductor layer 104. Accordingly, in order to make an energy level of electrons uniform, the corresponding plurality of quantum well layers 103b-1, 103b-2, 103b-3, and 103b-4 may have their indium (In) content gradually reduced with closer proximity to the p-type semiconductor layer 104. Thus, in this modification, in order to reduce an influence of piezoelectric polarization, a plurality of quantum barrier layers 103a-1, 103a-2, 103a-3, and 103a-4 may be formed to be gradually thinner toward the p-type semiconductor layer 104.

Figure 7:
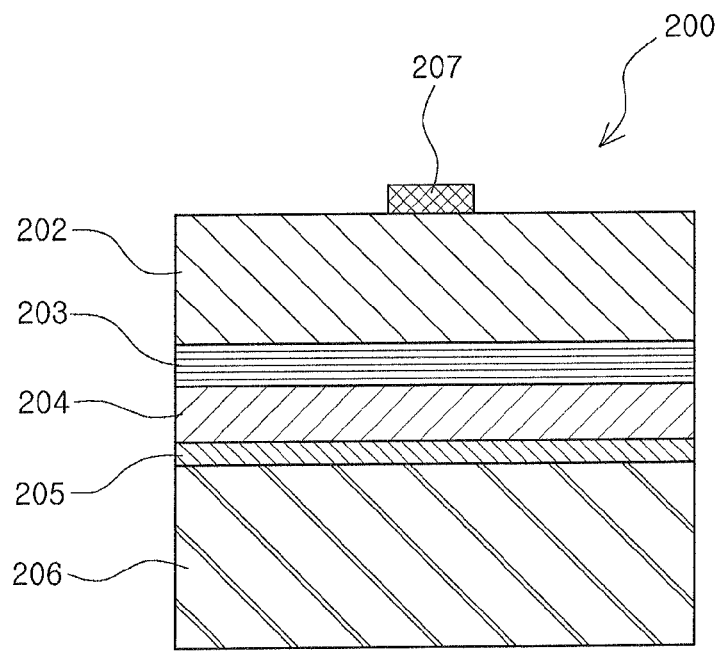
FIG. 7 is a cross-sectional view schematically showing a nitride semiconductor light emitting device according to an exemplary embodiment of the present inventive concept.

FIG. 7 is a cross-sectional view schematically showing a nitride semiconductor light emitting device according to an embodiment of the present inventive concept. In the nitride semiconductor light emitting device (LED) 200, a light emitting structure is formed on a conductive substrate 206, and the light emitting structure includes an n-type semiconductor layer 202, an active layer 203, and a p-type semiconductor layer 204. Also, in the present embodiment, the active layer 203 may have any multi-quantum well MQW structure in accordance with the inventive concept such as the examples described above with reference to FIGS. 2 through 5, to thereby improve luminous efficiency and driving voltage characteristics.

An n-type electrode 207 is formed on the n-type semiconductor layer 202, and a reflective metal layer 205 and a conductive substrate 206 may be formed under the p-type semiconductor layer 204. The reflective metal layer 205 may be made of a material having electrically ohmic-characteristics with the p-type semiconductor layer 204. The material of the reflective metal layer 205 may be a metal having high reflectivity to reflect light emitted from the active layer 203. In consideration of this reflective function, the reflective metal layer 205 may be formed to include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like.

The conductive substrate 206 may be connected to external power to apply an electrical current or a modulated current signal to the p-type semiconductor layer 204. Also, the conductive substrate 206 may serve as a physical support supporting the light emitting structure during a manufacturing process such as a laser lift-off process, or the like, for removing a substrate used for a semiconductor growth. The conductive substrate 206 may be made of a material including any one of gold (Au), nickel (Ni), aluminum (Al), copper (Cu), tungsten (W), silicon (Si), selenium (Se), and GaAs, e.g., a material doped with aluminum (Al) on a silicon (Si) substrate. In this case, the conductive substrate 206 may be formed on the reflective metal layer 205 through a process such as plating, sputtering, deposition, or the like, and alternatively, a previously fabricated conductive substrate 206 may be joined to the reflective metal layer 205 by the interposition of a conductive adhesive layer, or the like.

As set forth above, according to embodiments of the inventive concept, a semiconductor light emitting device in which thicknesses and band gap energy of respective layers constituting the active layer are optimized to minimize an influence of piezoelectric polarization affecting the active layer, thereby improving carrier recombination efficiency and minimizing an increase in a driving voltage can be obtained.

However, the features of various embodiments of the present inventive concept are not limited to the above and any effect that can be recognized from the technical solutions and embodiments described hereinabove may be included although not yet observed.

While the present inventive concept has been shown and described in connection with the exemplary embodiments, it will be apparent to those skilled in the art that modifications and variations can be made without departing from the spirit and scope of the inventive concept as defined by the appended claims.

What is claimed is:

1. A semiconductor light emitting device comprising:
   a n-type semiconductor layer;
   a p-type semiconductor layer; and
   an active layer disposed between the n-type and p-type semiconductor layers and having a structure in which a plurality of quantum well layers and a plurality of quantum barrier layers are alternately positioned,
   wherein the plurality of quantum well layers are made of $Al_xIn_yGa_{1-x-y}N$ ($0 \le x < 1$, $0 < y \le 1$) and each of the plurality of quantum well layers contains a different indium (In) content, and, among the plurality of quantum barrier layers, a quantum barrier layer adjacent to a quantum well layer having a higher indium (In) content is thicker than a quantum barrier layer adjacent to a quantum well layer having a lower indium (In) content.

2. The semiconductor light emitting device of claim 1, wherein, among the plurality of quantum well layers, a quantum well layer having a lower indium (In) content is thicker than a quantum well layer having a higher indium (In) content.

3. The semiconductor light emitting device of claim 2, wherein, among the plurality of quantum well layers, a quantum well layer having a lower indium (In) content is disposed closer to the p-type semiconductor layer than a quantum well layer having a higher indium (In) content.

4. The semiconductor light emitting device of claim 2, wherein, among the plurality of quantum well layers, the wavelength of light emitted from the quantum well layer having a higher indium (In) content and the wavelength of light emitted from the quantum well layer having a lower indium (In) content are substantially the same.

5. The semiconductor light emitting device of claim 2, wherein, each of the plurality of quantum well layers emit substantially the same wavelengths of light.

6. The semiconductor light emitting device of claim 1, wherein the plurality of quantum well layers are increasingly thicker towards the p-type semiconductor layer.

7. The semiconductor light emitting device of claim 6, wherein the plurality of quantum well layers have their indium (In) content gradually reduced towards the p-type semiconductor layer.

8. The semiconductor light emitting device of claim 7, wherein the plurality of quantum barrier layers have thicknesses gradually reduced towards the p-type semiconductor layer.

9. The semiconductor light emitting device of claim 1, wherein, among the plurality of quantum barrier layers, the thickness of a quantum barrier layer adjacent to a quantum well layer having a higher indium (In) content and closer to the p-type semiconductor layer is greater than the thickness of a quantum barrier layer adjacent to a quantum well layer having a lower indium (In) content.

10. The semiconductor light emitting device of claim 1, wherein as the indium (In) content of the plurality of quantum well layers is increased, the magnitude of piezoelectric polarization is greater.

11. The semiconductor light emitting device of claim 1, wherein the plurality of quantum barrier layers do not contain indium (In).

12. The semiconductor light emitting device of claim 1, wherein the plurality of quantum barrier layers have a lower indium (In) content than the indium (In) content of the plurality of quantum well layers adjacent thereto.

13. A semiconductor light emitting device comprising:
    a n-type semiconductor layer;
    a p-type semiconductor layer; and
    an active layer disposed between the n-type and p-type semiconductor layers and including a stack comprising:
      a first quantum well layer adjacent to the n-type semiconductor layer;
      a first quantum barrier layer adjacent to the first quantum well layer;
      a second quantum well layer;
      a second quantum barrier layer adjacent to the second quantum well layer; and
      a third quantum well layer adjacent to a third quantum barrier layer,
      the third quantum barrier layer adjacent to the p-type semiconductor layer;
    wherein the indium (In) content of the first quantum well layer is different than the indium (In) content of the third quantum well layer, wherein among the plurality of quantum barrier layers, a quantum barrier layer adjacent to a quantum well layer having a higher indium (In) content is thicker than a quantum barrier layer adjacent to a quantum well layer having a lower indium (In) content.

14. The semiconductor light emitting device of claim 13, wherein the third quantum well layer has a lower indium (In) content than the first quantum well layer and is thicker than the first quantum well layer.

15. The semiconductor light emitting device of claim 13, wherein each of the plurality of quantum well layers are made of $Al_xIn_yGa_{1-x-y}N$ ($0 \le x < 1$, $0 < y \le 1$).

16. The semiconductor light emitting device of claim 13, wherein the indium (In) content of the first, second, and third quantum well layers are different.

17. The semiconductor light emitting device of claim 13, wherein, the first quantum barrier layer is thicker than the third quantum barrier layer.

18. A semiconductor light emitting device, comprising:
    a n-type semiconductor layer;
    a p-type semiconductor layer; and
    an active layer disposed between the n-type and p-type semiconductor layers and including a stack comprising:
      a first quantum well layer adjacent to the n-type semiconductor layer;
      a first quantum barrier layer adjacent to the first quantum well layer;
      a second quantum well layer;
      a second quantum barrier layer adjacent to the second quantum well layer; and
      a third quantum well layer adjacent to a third quantum bather layer, the third quantum barrier layer adjacent to the p-type semiconductor layer;
    wherein the indium (In) content of the first quantum well layer is different than the indium (In) content of the third quantum well layer, and wherein, the first quantum barrier layer is thicker than the third quantum barrier layer.

19. The semiconductor light emitting device of claim 18, wherein the third quantum well layer has a lower indium (In) content than the first quantum well layer and is thicker than the first quantum well layer.

20. The semiconductor light emitting device of claim 18, wherein, the second quantum well layer has a lower indium (In) content than the first quantum well layer and is thicker than the first quantum well layer.

* * * * *